United States Patent [19]

Hayashi et al.

[11] Patent Number: 4,756,047
[45] Date of Patent: Jul. 12, 1988

[54] APPARATUS FOR REMOVING ORGANIC SUBSTANCE FROM SUBSTRATE

[75] Inventors: Noriyuki Hayashi, Shiga; Hiromi Murayama; Yukihiko Ishino, both of Kyoto, all of Japan

[73] Assignee: Dainippon Screen Mfg. Co., Ltd., Kyoto, Japan

[21] Appl. No.: 919,226

[22] Filed: Oct. 15, 1986

[30] Foreign Application Priority Data

Oct. 28, 1985 [JP] Japan .................. 60-164215[U]

[51] Int. Cl.[4] .................. B08B 3/02; B08B 5/02
[52] U.S. Cl. .................. 15/306 B; 15/312 R; 15/316 R
[58] Field of Search .......... 15/316 R, 303, 306 B, 15/312 R; 198/468.6, 774; 414/750; 432/239

[56] References Cited

U.S. PATENT DOCUMENTS

| 4,407,406 | 10/1983 | Norris | 198/774 |
| 4,483,040 | 11/1984 | Magee et al. | 15/312 R X |
| 4,485,519 | 12/1984 | Collier | 15/385 X |
| 4,500,407 | 2/1985 | Boys et al. | 198/774 X |
| 4,591,044 | 5/1986 | Ogami et al. | 198/774 X |

Primary Examiner—Chris K. Moore
Attorney, Agent, or Firm—Hayes, Davis & Soloway

[57] ABSTRACT

An apparatus for removing organic substances from a substrate, including ultraviolet lamps provided above a horizontal hot plate on which a substrate is placed; an ozone blow-off pipe which blows ozone downward, provided at a position appropriately distant from the surface of the hot plate on which the substrate is placed, the ozone blow-off pipe being so arranged as to be reciprocated relative and parallel to the surface of the hot plate.

8 Claims, 3 Drawing Sheets

APPARATUS FOR REMOVING ORGANIC SUBSTANCE FROM SUBSTRATE

BACKGROUND OF THE INVENTION

The present invention relates to an apparatus for removing organic substances from a substrate, which is used for removing organic contaminants stuck on the surface of a substrate; removing, before etching, any resist remaining at resist pattern openings after development, or removing, after etching, any photoresist remaining on the surface of a substrate, by the use of ozone and irradiation with ultraviolet rays. These are required when semiconductor substrates, substrates for photomasks or substrates for liquid crystal displays (hereinafter referred to as "substrates") are coated with photoresists for carrying out photo-etching.

In producing semiconductors, in order to remove organic substances stuck on the surface of substrates or unnecessary resists remaining after development processing, cleaning of the surface of the substrates is performed by feeding ozone to the substrate while being radiated with ultraviolet rays, thereby decomposing the organic substances by cooperative action of ultraviolet rays and ozone.

In Japanese unexamined patent publication No. 193030/1984, entitled "Treatment apparatus", a dry washing apparatus is disclosed in which oxygen gas is fed to a treatment chamber internally provided with an ultraviolet source to generate ozone therein, and a substrate to be treated is introduced into the treatment chamber. According to this prior art apparatus, the substrate being treated is placed on a reciprocating transport section and conveyed into or out of the treatment chamber. Oxygen gas is blown along the surface of the substrate in one direction. This apparatus is characterized by the transport section which is designed to support a substrate at only its peripheral edge portion so that the face and back of the substrate may be open.

In the above prior art apparatus, there is concern that the treatment effect of the gas to the surface of the substrate is different between the part of the substrate near to a gas outlet and the part distant therefrom, resulting in the non-uniformity of treatment. This difference is due to having the arrangement in which the oxygen gas used for the dry washing is blown off along the surface of the substrate in one direction.

In the prior art means, there is another problem. Since the amount of ozone to be formed by ultraviolet rays is small, the ability to decompose and remove organic contaminants stuck on the substrate is poor and the treatment requires a longer time accordingly.

SUMMARY OF THE INVENTION

An object of the present invention is to provide an apparatus that can eliminate the disadvantages in the prior art.

According to the present invention, there is provided an apparatus for removing organic substances from a substrate, comprising a hot plate for receiving the substrate on its surface and heating it to a desired temperature; ultraviolet lamps fixedly arranged above said hot plate and in parallel with the surface of the hot plate; and an ozone blow-off pipe provided with downwardly directed openings, said ozone blow-off pipe being provided so as to be reciprocated relative to and parallel with the surface of said hot plate.

In a preferred embodiment, a pair of grooves are formed on the surface of the hot plate along the direction in which the substrate is transported. A pair of walking beams are provided such that they can be received by and moved through or raised above and moved over said grooves when reciprocated in the direction in which the substrate is transported. The ozone blow-off pipe is mounted on said walking beams such that the pipe crosses the direction in which the substrate is transported and the pipe is in a position slightly above the surface of the substrate when the substrate is placed on the hot plate and said walking beams are held in said grooves.

In still another preferred embodiment, ozone gas is sprayed from the ozone blow-off pipe while the walking beams are being held in the grooves and reciprocated in the direction in which the substrate is transferred.

In a further preferred embodiment, a plurality of hot plates, each of which is equipped with an ozone blow-off pipe, are arranged in the direction in which the substrate is transported and a pair of walking beams are so provided as to be commonly used for said hot plates.

In a still further preferred embodiment, a pair of beams parallel to said pair of the walking beams are fitted to arms extending from the respective ends of said walking beams toward the outer side of the hot plates. The ozone blow-off pipe is installed on and across said beams.

Preferably, an ultraviolet-transmissive plate member is provided. This plate member is fixed to the ozone blow-off pipe on either side of the pipe along the direction the substrates are transported. The plate member is substantially parallel to and slightly distant from the surface of the hot plate. Said plate member is so adapted as to be reciprocated together with the ozone blow-off pipe.

Still preferably, the ultraviolet-transmissive plate member is made of quartz.

Preferably, a suction opening for removal of the gas is provided at at least the end portions of a substrate-holding area on the periphery of the hot plate.

Hence, according to the invention, organic substances sticking on the substrate or remaining resists are decomposed and removed by the cooperative action of the ultraviolet rays from the ultraviolet lamp and the ozone gas blown off from the ozone blow-off pipe.

Additionally, they are decomposed and removed uniformly without any non-uniformity of treatment over the whole surface of the substrate since the ozone blow-off pipe moves relative to the hot plate and the ultraviolet lamp.

DESCRIPTION OF THE PREFERRED EMBODIMENTS

Figure 1:
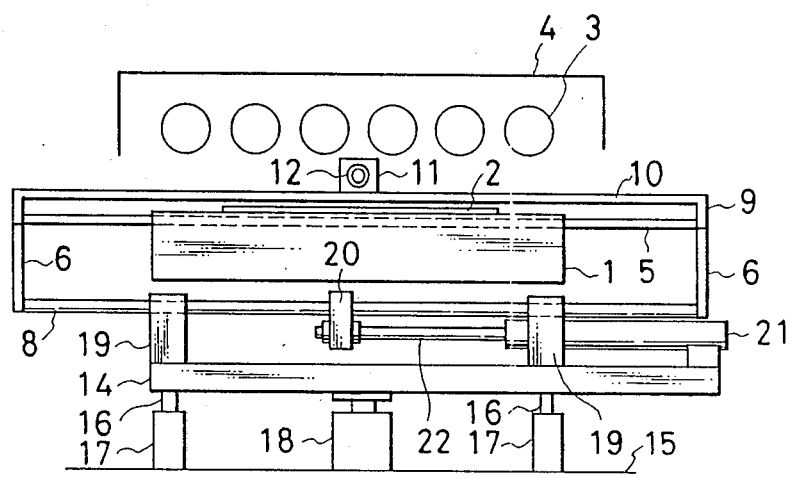
FIG. 1 is a front view of a first embodiment according to the present invention.
Figure 2:
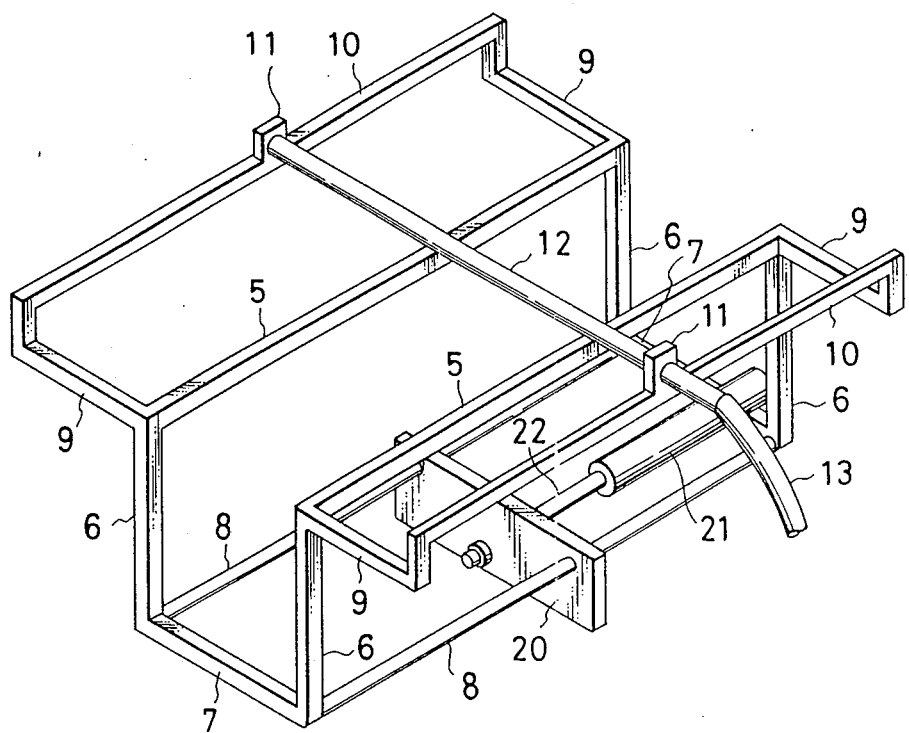
FIG. 2 is a perspective view showing a supporting framework for walking beams and an ozone blow-off pipe used in the first embodiment of the present invention.

In a first embodiment of the present invention, FIG. 1 is a front view schematically showing the first embodiment of the present invention, and FIG. 2 is a perspective view showing a supporting framework for walking beams and an ozone blow-off pipe used in the apparatus of the first embodiment.

In FIG. 1, a hot plate 1 is fixed at a desired position on the apparatus, has an appropriate heat source within the inside thereof, and heats a substrate 2 being treated on its surface. Above the hot plate 1, there is installed a lamp housing 4 in which a plurality of ultraviolet lamps 3 are arranged.

In the surface of the hot plate 1, a pair of grooves are formed on the right and left of the surface along the direction in which the wafer is transported, and a pair of walking beams are freely inserted in such a manner that they can be received by and moved through or raised above and moved over the grooves.

The walking beams 5 are supported and moved by the framework shown in FIG. 2. This framework comprises a pair of front and rear support rods 6 extending vertically downward from the respective ends of the walking beams 5, a pair of beams 7 extending laterally between the support rods 6 and a pair of slidable rods 8 connecting the lower ends of the respective support rods 6 and the respective ends of beams 7.

L-shaped arms 9 protrude outward from the respective ends of the walking beams 5 in the front to rear directions and the top ends of these arms are connected by a pair of beams 10. At substantially the center of each of these beams 10, there is a bearing 11 in which a hollow tubular nozzle 12 is inserted.

In the nozzle 12, a plurality of gas blow-off holes (not shown) are downwardly directed or, alternatively, slit-shaped openings are downwardly directed, so that ozone gas may be fed from a hosepipe 13 connected at an end of the nozzle 12 and sprayed from the blow-off holes onto the substrate 2 placed on the hot plate 1.

An elevator base 14 is provided beneath the hot plate 1. This elevator base 14 is movable upwardly and downwardly and supported by a base 15 via rods 16 and guide sleeves 17 both extending vertically therefrom, and upwardly or downwardly driven by an air cylinder 18. On the upper surface of the elevator base 14 are a pair of front and rear bearing means 19 through which the slidable rods 8 for supporting the walking beams 5 are inserted.

At substantially the center of each of the slidable rods 8, a driving bar 20 is fixed. An end of a rod 22 of an air cylinder 21 mounted on the elevator base 14 is connected to the driving bar 20.

By upwardly and downwardly moving the elevator base 14 by means of the air cylinder 18, the walking beams 5 are moved upward and downward between the position at which they are received by the grooves on the hot plate 1 and the position at which they are raised above the upper surface of the hot plate 1. They are also reciprocated in the longitudinal direction by the action of the air cylinder 21, thereby moving through the grooves when received therein and moving over the grooves when raised above.

More specifically, the walking beams 5 are driven in the direction opposite to the direction in which the wafer being treated 2 is transported when they are in the grooves, and when they are at the raised position, they raise the substrate being treated 2 and transport it when driven in the direction opposite to the direction driven when in the grooves. Repeating this operation, the substrate 2 can be transported in a desired direction.

In the decomposition treatment of organic substances using ozone gas, the air cylinder 18 is contracted to lower the elevator base 14, and the air cylinder 21 is actuated as the walking beams are received in the grooves. The nozzle 12 mounted on the walking beams 5 is reciprocated along the upper surface of the substrate 2 placed on the hot plate 1. Ozone gas is fed from the hosepipe 13 to be sprayed from the blow-off holes in the nozzle 12 on the surface of the substrate 2 being treated. The cleansing treatment is thus carried out.

As described above, the apparatus of the present invention is constructed such that ozone is sprayed on the surface of substrate 2 while the nozzle 12 for feeding the ozone is traveling longitudinally above the surface of the substrate 2 to be treated. Accordingly, the whole surface of the substrate 2 can be uniformly treated.

Moreover, since the ultraviolet rays are irradiated while ozone gas is being blown off an especially strong cleansing effect can be obtained.

Additionally, since only the nozzle 12 for blowing off ozone travels above the substrate 2 being treated, without any other driving mechanisms, there is no problem that foreign matters such as metallic particles and oily droplets may stick to the surface of the substrate 2 to contaminate the same.

In the above first embodiment of the present invention, one nozzle 12 travels over the surface of one hot plate 1. However, the present invention is by no means limited thereto, and can also cover another embodiment according to which a plurality of hot plates and nozzles are provided.

Figure 3:
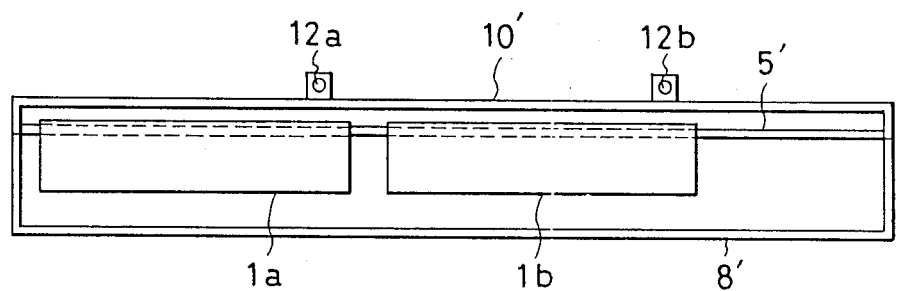
FIG. 3 is a schematic illustration of an apparatus according to a second embodiment of the present invention.

FIG. 3 is a schematic view illustrating the main part of an apparatus according to a second embodiment of the present invention, in which there are two hot plates each with a nozzle. In this embodiment, two hot plates 1a and 1b are arranged in the direction in which the wafer being treated is transported. Walking beams 5', slidable rods 8' and beams 10' are made longer then those shown in FIG. 1 by a length corresponding to the length of the additional hot plate. Two nozzles 12a and 12b are provided at the positions corresponding to the respective hot plates.

If necessary, more sets of the hot plates and the nozzles can be arranged in the similar manner as above. Appropriate sets of them may be arranged according to working processes.

Figure 4:
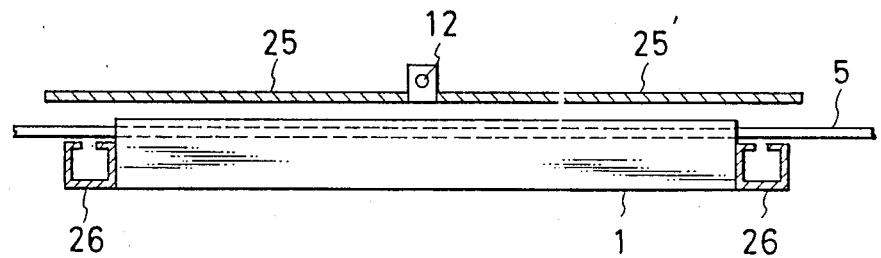
FIG. 4 is a schematic view illustrating the main part of an apparatus according to a third embodiment of the present invention.

In a third embodiment of the present invention, shown in FIG. 4, a pair of ultraviolet-transmissive plate members 25 and 25' are made of quartz or the like and being parallel with the surface of the hot plate 1 are fixed to the ozone blow-off pipe 12 on both sides of the pipe along the substrate-transporting direction with respect to the pipe used in the apparatus of the first embodiment shown in FIG. 1. The plate members 25 and 25' are adapted such that they move together with the ozone blow-off pipe 12. Provision of these plate members 25 and 25' makes it possible for the ozone gas sprayed out of the ozone blow-off pipe 12 to be efficiently brought into contact with the surface of the substrate 2 being treated, thereby further improving the removal of organic contaminants.

Since the plate members 25 and 25' are made of ultraviolet-transmissive quarts or the like, there is no interference with the organic substance-removing effective provided by the ultraviolet radiation.

In the apparatus of this third embodiment, a suction chamber 26 for removing ozone gas is preferably provided at an appropriate place, e.g., at the front and rear portions etc. of the hot plate 1.

Figure 5:
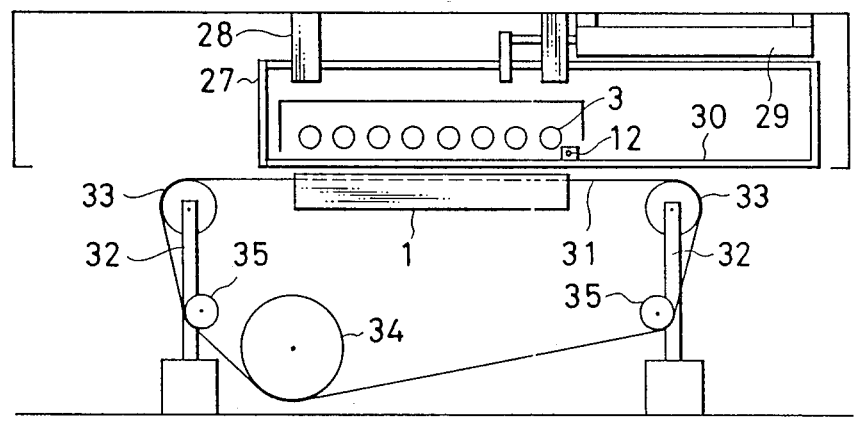
FIG. 5 is a schematic view illustrating an apparatus according to a fourth embodiment of the present invention.

As a further embodiment, FIG. 5 is a schematic view of an apparatus according to a fourth embodiment of the present invention. According to the first three embodiments described above, the substrate being treated is transported by means of the walking beams, and constructed such that the ozone blow-off pipe is driven by the walking beams. In the apparatus according to this fourth embodiment, however, the walking beams are replaced by a wire performing similar action to transport the wafer, and, on the other hand, the ozone blow-off pipe is designed to be reciprocated along the surface of the hot plate by a reciprocating means provided independently of the above transporting wire.

In FIG. 5, hot plate 1 and ultraviolet lamps 3 are the same as those of the first three embodiments described above. Above the hot plate 1, a frame 27 is supported by means of a bearing 28 in such a manner that they may be slidable in the direction in which the wafer is transported, and can be reciprocated by means of an air cylinder 29. The ozone blow-off pipe 12 crossing the direction in which the wafer is transported is installed on a lower member 30 of the frame 27.

However, the fourth embodiment differs from the first three described above in that a pair of right-and-left wire loops 31 extend downward around the hot plate from its upper surface. Each of these wires 31 is set around a pair of guide pulleys 33 supported on a pair of elevator arms 32 provided at the front and rear portions of the hot plate 1, and around a driving pulley 34 provided at an appropriate place beneath the hot plate, and around an appropriate number of tension pulleys 35 for keeping constant the tension of the wires 31 when the guide pulleys 33 are upwardly or downwardly displaced by the elevator arms 32.

A pair of the front and rear guide pulleys 33 are moved upward or downward by synchronously expanding or contracting the respective elevator arms 32, whereby the wires 31 are raised above or received in the grooves formed on the hot plate 1. When the wires 31 are driven by the driving pulley 34 and are in the raised position, the wafer can be transported as desired.

Using wire means for transporting the wafer is advantageous in that the wire does not need to be driven for reciprocation as in the use walking beams in the respective embodiments previously mentioned. Rather, the wire needs to be driven in one direction only whereby drive controlling means may be simplified. Additionally, since the grooves to be formed on the hot plate 1 may be narrower than when using walking beams, the heating of the substrate can be more uniform.

The above means using the wires can be applied also in the apparatus shown in FIG. 3, comprising a plurality of hot plates arranged in the direction in which the wafer is transported.

In the foregoing respective embodiments, the ozone blow-off pipe is constructed so it may be reciprocated along the direction in which the wafer is transported, but necessarily limited to that direction. For example, in the fourth embodiment, it may be constructed so the ozone blow-off pipe can be reciprocated in the direction crossing the direction in which the wafer is transported without any change in effectiveness of removing organic substances.

As apparent from the foregoing descriptions, the present invention may give the following effects:

(1) Since the ozone can be uniformly fed to the whole surface of the wafer being treated, the treatment to remove organic contaminants stuck on the surface of a substrate can be carried out uniformly over the whole surface.

(2) Strong cleansing effect can be achieved by irradiation with ultraviolet rays in combination with exposure to ozone.

(3) When the ultraviolet-transmissive plate is attached to the ozone blow-off pipe, the organic substances can be removed more efficiently and treatment can be performed more quickly.

The specification is meant to serve as an example of the present invention and not meant to limit the scope and breadth of the claims.

What is claimed is:

1. An apparatus for removing organic substances from a substrate, comprising a hot plate defining a support surface for receiving the substrate and heating that substrate to a desired temperature; ultraviolet lamps fixedly arranged above said hot plate and disposed in parallel with said surface of said hot plate; and an ozone blow-off pipe provided with downwardly directed toward said surface openings; said ozone blow-off pipe being reciprocatable relative to and parallel with said surface of said hot plate.

2. The apparatus according to claim 1, wherein a pair of grooves are formed in said surface of said hot plate along a direction in which said substrate is transported; a pair of walking beams are provided such that they can be located in or raised above said grooves and can be reciprocated in the direction in which the substrate is transported to convey the substrate in its direction of transport when raised above said grooves; and said ozone blow-off pipe is mounted on said walking beams such that said pipe extends traversely of the direction in which said substrate is transported and that said pipe is disposed over the substrate placed on the hot plate when said walking beams are in said grooves.

3. The apparatus according to claim 2, wherein ozone gas is sprayed from the ozone blow-off pipe while the walking beams are reciprocated while in the grooves.

4. The apparatus according to claim 2 or 3, wherein a plurality of hot plates are arranged along the direction in which the substrate is transported; a pair of said walking beams are common to said hot plates; and each of said hot plates is associated with a ozone blow-off pipe.

5. The apparatus according to claim 2, wherein a pair of beams parallel to said pair of the walking beams are fitted to arms extending from the respective ends of said walking beams toward the outer side of the hot plates; and said ozone blow-off pipe is installed on and across said pair of beams.

6. The apparatus according to claim 1, wherein an ultraviolet-transmissive plate member, substantially parallel to said hot plate surface is attached to the ozone blow-off pipe forward and backward in the direction of substrate transport with respect to the pipe.

7. The apparatus according to claim 6, wherein said ultraviolet-transmissive plate member is made of quartz.

8. The apparatus according to claim 1, wherein a suction opening in a suction chamber for exhaustion of the gas is provided at the periphery of the hot plate.

* * * * *